United States Patent [19]

Blauschild

[11] Patent Number: 4,593,268

[45] Date of Patent: Jun. 3, 1986

[54] ANALOG-TO-DIGITAL CONVERTER USING ABSOLUTE-VALUE CONVERSION

[75] Inventor: Robert A. Blauschild, Los Altos, Calif.

[73] Assignee: Signetics Corporation, Sunnyvale, Calif.

[21] Appl. No.: 468,720

[22] Filed: Feb. 22, 1983

[51] Int. Cl.[4] ............................................. H03K 13/02
[52] U.S. Cl. ............................. 340/347 AD; 330/100; 340/347 CC; 340/347 M
[58] Field of Search ................. 340/347 AD, 347 CC, 340/347 M; 330/99, 100, 138

[56] References Cited

PUBLICATIONS

G. J. J. Vos "Een Snelle 8-bits Analoog/Digitaalomzetter", Polytechnisch Tijdschrift, E, 35, Feb. 1980, pp. 112–118.

Primary Examiner—T. J. Sloyan
Attorney, Agent, or Firm—R. Meetin; R. Mayer; J. Oisher

[57] ABSTRACT

An absolute-value analog-to-digital converter containing a chain of matched main absolute-value differential amplifiers ($A_1$–$A_N$) has a gain control for regulating the gain of each main amplifier utilizing an auxiliary absolute-value differential amplifier ($A_{GC}$) matched to the main amplifiers. An offset control in the converter drives the offsets of the amplifiers toward zero by using a further absolute-value differential amplifier ($A_{OC}$) matched to the other amplifiers. The gain and offset control are implemented with suitable feedback circuitry.

16 Claims, 7 Drawing Figures

ANALOG-TO-DIGITAL CONVERTER USING ABSOLUTE-VALUE CONVERSION

FIELD OF THE INVENTION

This invention relates generally to analog-to-digital (A/D) converters suitable for semiconductor integrated circuits and particularly to such A/D converters employing absolute-value conversion techniques.

BACKGROUND ART

A/D converters using absolute-value algorithms achieve high conversion speed because clocking is generally not necessary. Referring to FIG. 1, it illustrates a conventional absolute-value converter in which an analog voltage signal $V_I$ is converted into an N-bit digital signal represented as bits 1, 2, ... J, ... N−1 and N. Bit 1 is the most significant bit (MSB), while bit N is the least significant bit (LSB).

In this converter, an input circuit 10 operates on analog voltage $V_I$ to produce an analog input signal $V_{I1}$ which is supplied to the first amplifier $A_1$ in a chain of N−1 main absolute-value differential amplifiers $A_1$, $A_2$, ... $A_J$, ... and $A_{N-1}$. Upon receiving a mainline input signal $V_{IJ}$ and a reference input signal, each amplifier $A_J$ amplifies the absolute value of their voltage difference to produce an output signal $V_{OJ}$ which is supplied as the mainline input $V_{IJ+1}$ to the next amplifier $A_{J+1}$. This procedure is followed with all of outputs $V_{OJ}$ except output $V_{ON-1}$ which is supplied as mainline input $V_{IN}$ to a buffer 12 that receives a reference input but may not be an absolute-value differential amplifier.

A set of N comparators $C_1$, ... $C_J$, ... $C_{N-1}$, and $C_N$ corresponding respectively to amplifiers $A_1$, ... $A_J$, ... and $A_{N-1}$ and buffer 12 generates the digital signal. In particular, each comparator $C_J$ generates bit J using the inputs to corresponding amplifier $A_J$ or buffer 12. Typically, comparator $C_J$ does not directly compare these inputs but instead compares a pair of intermediate signals $V_{YJ}$ and $V_{ZJ}$ generated from the inputs. The generation of signals $V_{YJ}$ and $V_{ZJ}$ is represented by the dashed lines within each amplifier $A_J$ or buffer 12.

In a common absolute-value converter, each amplifier $A_J$ has an optimum gain of precisely 2. Mainline inputs $V_{I1}$–$V_{IN}$ all vary over the same voltage range from a lower end-point level $V_L$ to an upper end-point level $V_U$, both of which are normally fixed. The reference inputs to amplifiers $A_1$–$A_{N-1}$ and buffer 12 are all at the mid-range level $(V_U+V_L)/2$. Neglecting any gain error or offset in output $V_{OJ}$ from its nominal value, output $V_{OJ}$ is given by the transfer function $2|V_{IJ}-(V_U+V_L)/2|+V_L$ for each amplifier $A_J$. Setting $V_{IJ}$ as either $V_L$ or $V_U$ yields $V_U$ as the maximum $V_{OJ}$ output, while entering $(V_U+V_L)/2$ into this transfer function yields $V_L$ as the minimum $V_{OJ}$ output. These extreme $V_{OJ}$ values are precisely the necessary voltage range for the next input $V_{IJ+1}$.

Offsets and gain errors resulting, for example, from temperature variation and manufacturing imprecision can cause errors in the digital signal. Some prior absolute-value A/D converters have used complicated precision amplifier cells to overcome this problem. These cells occupy a relatively large area which makes this solution undesirable. In addition, conversion speed is limited because large amounts of feedback are needed.

Another solution suggested by G. J. J. Vos in "een snelle 8-bits analoog/digitaalomzetter", *Polytechnisch Tijdschrift*, Elektrotechnick/Elektronica, Vol. 35, Feb. 1980, pp. 112–118, is to regulate amplifiers $A_1$–$A_{N-1}$ with an open-loop control system represented as item 14 in FIG. 1. As the Vos control system is understood, it basically attempts to force the offset of each amplifier $A_J$ to zero. Incidental to this offset control, the Vos system also appears to provide some gain regulation. Although Vos is a step forward, its open-loop control is still relatively imprecise.

FIG. 2 shows the basic bipolar circuit that Vos uses for each amplifier $A_J$. Inputs $V_{IJ}$ and $(V_U+V_L)/2$ are supplied respectively to the bases of a pair of NPN transistors $Q1_A$ and $Q1_B$ whose emitters are coupled to each other through a pair of resistors $R1_A$ and $R1_B$ separated by a node 16. Transistors $Q1_A$ and $Q1_B$ amplify the voltage difference between their bases. Their collectors supply the amplified difference to the bases of a pair of NPN transistors $Q2_A$ and $Q2_B$, respectively, whose emitters which are tied together at a node 18 provide the absolute value of the amplified difference to one end of resistor $R_A$. Output $V_{OJ}$ is taken at the other end of resistor $R_A$. The collectors of transistors $Q2_A$ and $Q2_B$ are cross-coupled to their bases through a pair of resistors $R2_B$ and $R2_A$, respectively, and to a source of a high supply voltage $V_{CC}$ through a pair of resistors $R3_B$ and $R3_A$, respectively. The purpose of the cross-coupling is to cause output $V_{OJ}$ to vary linearly with mainline input $V_{IJ}$ when it is near the reference input.

A current source consisting of an NPN transistor Q3 and a resistor $R_G$ connected together between node 16 and a source of a low supply voltage $V_{EE}$ provides the operating current for transistors $Q1_A$ and $Q1_B$. Likewise, a current source consisting of an NPN transistor Q4 and a resistor $R_B$ connected together between the $V_{EE}$ supply and resistor $R_A$ provides the operating current for transistors $Q2_A$ and $Q2_B$. Control system 14 drives the bases of transistors Q3 and Q4 in an effort to reduce the offset to as low a value as possible, preferably zero. As pointed out above, system 14 also incidentally appears to affect amplifier gain. This general type of absolute-value differential amplifier is particularly suitable for absolute-value D/A converters because of its overall simplicity and its capability for good input-to-output linearity.

DISCLOSURE OF THE INVENTION

In accordance with the invention, an absolute-value A/D converter employing a chain of matched main absolute-value differential amplifiers has a gain-control system that regulates the gain of each main amplifier by utilizing an auxiliary absolute-value differential amplifier matched to the main amplifiers. An offset-control system in the converter causes the offsets of the amplifiers to closely approach zero through the use of a further absolute-value differential amplifier matched to the other amplifiers.

More particularly, the present device converts an analog signal into a digital signal. Each of the main amplifiers, designated sequentially as the first amplifier through the last amplifier, produces an output signal by amplifying the absolute value of the voltage difference between a mainline input signal and a reference input signal. The analog signal is the mainline signal to the first amplifier. The output signal of each amplifier except the last amplifier is the mainline signal to the next amplifier. A comparing circuit generates the digital signal by determining whether the mainline signal to each amplifier exceeds its reference signal.

In the gain-control system, the auxiliary amplifier produces an auxiliary output signal from a pair of input signals. A gain-control feedback circuit responsive to the voltage difference between the auxiliary output signal and a signal substantially the same as the auxiliary output signal when the gain of the auxiliary amplifier is at a desired gain generates a gain-control signal. This signal controls a path back to the auxiliary amplifier to cause its gain to stabilize very near the desired gain. The gain-control signal also controls similar paths to the main amplifiers. Because the auxiliary amplifier is matched to the main amplifiers, their gains stabilize very near the desired gain.

In the offset-control system, the further amplifier produces a further output signal from a pair of substantially equal input signals. The further output signal thus differs from an end-point level (typically $V_L$) by no more than an offset. An offset-control feedback circuit responsive to the voltage difference between the further output signal and a signal at the end-point level generates an offset-control signal. This signal controls at least one path back to the offset-control system to drive the offset toward zero. Because of the amplifier matching, the offsets of the other amplifiers are likewise driven toward zero.

An important feature of the invention is the use of a switch in each main amplifier so as to enable it to be switchably operated as a latch that assumes one of a pair of binary logic states depending on whether its mainline signal exceeds its reference signal. When operated in the latch mode, each main amplifier provides at least one signal, and normally a pair of complementary signals, corresponding to the assumed logic state and representing a bit portion of the digital signal. This feature is achieved by configuring each main amplifier generally as in Vos with a pair of cross-coupled bipolar transistors that are used temporarily for data storage. Thus, the invention takes advantage of this cross-coupling not only to improve input-to-output linearity but also to provide a storage function in generating the digital signal.

The conversion speed of the present A/D converter is enhanced because it is very simple. In contrast to the prior art, the present invention provides accurate gain/-offset control with a greatly reduced component count. This significantly improves reliability. Moreover, A/D operation is largely insensitive to manufacturing imprecision or temperature variation.

BRIEF DESCRIPTION OF THE DRAWINGS

Like reference symbols are employed in the drawings and the description of the preferred embodiments to represent the same or very similar item or items.

DESCRIPTION OF THE PREFERRED EMBODIMENTS

Figure 3:
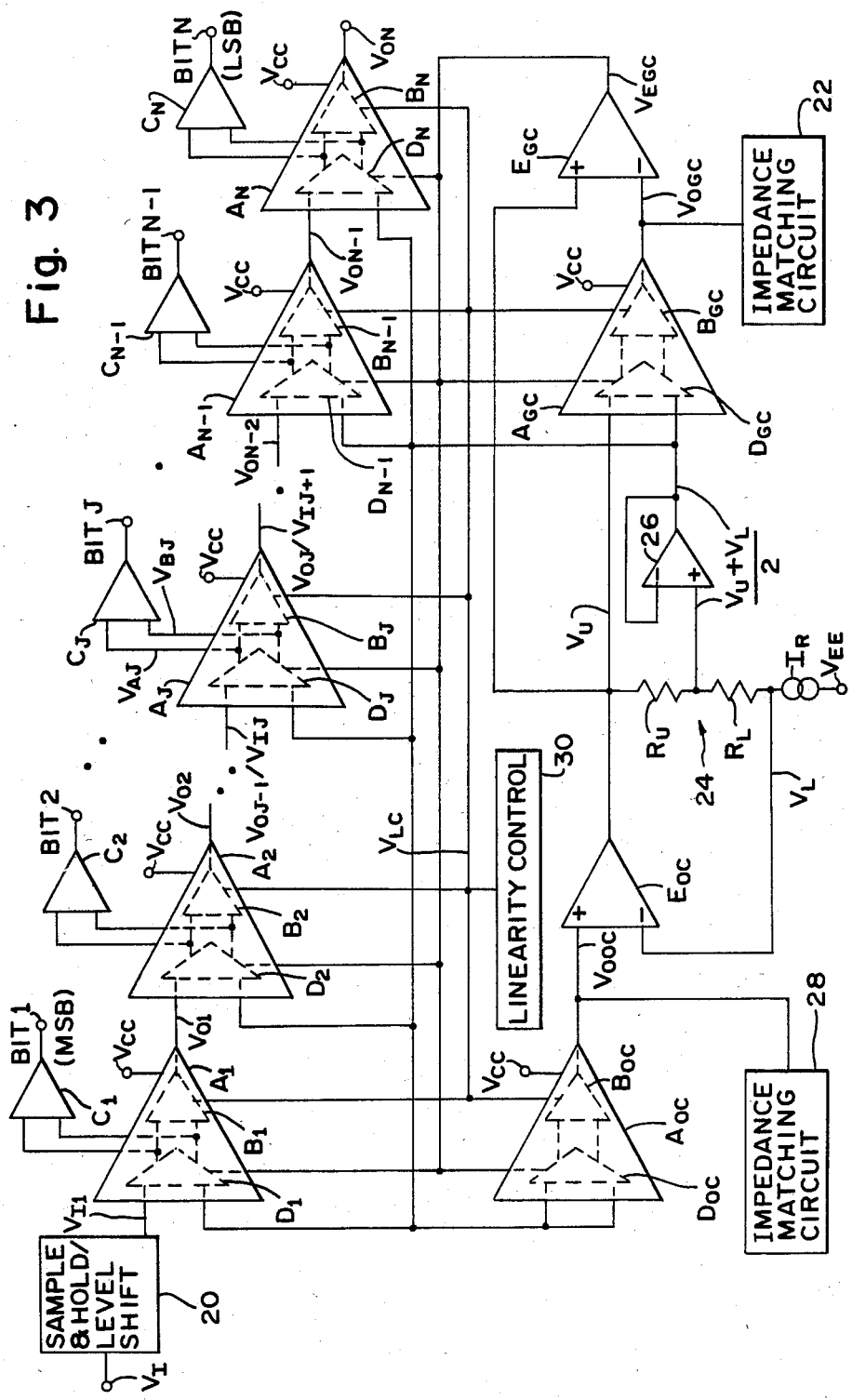
FIG. 3 is a block diagram of an absolute-value A/D converter in accordance with the invention in which each absolute-value differential amplifier has a desired gain of two and in which gain/offset control is achieved with a composite feedback system.

Turning to the drawings, FIG. 3 shows an absolute-value A/D converter for converting analog voltage signal $V_I$ into a digital signal represented by bits 1–N. A sample-and-hold/level shift circuit 20 operates on analog signal $V_I$ to produce analog signal $V_{I1}$ which is the actual signal converted into the digital signal. Circuit 20 may be conventional in design but is preferably a sample-and-hold circuit with associated level shift as disclosed in co-filed U.S. patent application Ser. No. 468,754. "Impedance Buffer with Reduced Settling Time", the contents of which are incorporated by reference herein. Ser. No. 468,754 is now U.S. Pat. No. 4,542,305.

This converter contains N main absolute-value gain-of-2 differential amplifiers $A_1, \ldots A_J, \ldots A_{N-1}$, and $A_N$ and corresponding comparators $C_1, \ldots C_J, \ldots C_{N-1}$, and $C_N$ which provide the N bits of the digital signal. Amplifiers $A_1$–$A_N$ are powered by the $V_{CC}$ supply and matched to one another. "Matched" here means configurationally the same (except perhaps for minor items which do not affect the pertinent operation) and subjected to substantially the same temperature variation. Matched items are usually, though not necessarily, substantially the same in a topographical sense—e.g., laid out the same on a semiconductor wafer and oriented in the same direction.

Analog signal $V_{I1}$ is the mainline input to amplifier $A_1$. Each amplifier $A_J$ generates its output signal $V_{OJ}$ by amplifying the absolute value of the voltage difference between its mainline input signal $V_{IJ}$ and its reference input signal. Each input $V_{IJ}$ is in the range of $V_L$ to $V_U$, of which both vary slightly here. The reference inputs to amplifiers $A_L$–$A_N$ are all $(V_U+V_L)/2$ which likewise varies slightly. Except for amplifier $A_N$, output $V_{OJ}$ of each amplifier $A_J$ is input $V_{IJ+1}$ to next amplifier $A_{J+1}$. As to amplifier $A_N$, its output $V_{ON}$ is not employed in the A/D conversion but may be used as a circuit test point.

Each amplifier $A_J$ consists of a differential amplifying portion $D_J$ and an absolute-value buffer portion $B_J$, both shown in dashed lines. Differential portion $D_J$ whose nominal gain is slightly over 2 amplifies the voltage difference between inputs $V_{IJ}$ and $(V_U+V_L)/2$ to generate a pair of signals $V_{AJ}$ and $V_{BJ}$. Buffer $B_J$ whose nominal gain is slightly under 1 generates output $V_{OJ}$ by determining the absolute value of the voltage difference between signals $V_{AJ}$ and $V_{BJ}$. Comparator $C_J$ generates bit J by comparing them to determine which is greater.

The transfer function ($V_{OJ}$) for each amplifier $A_J$ is $G|\Delta V_{IJ}|+V_L+V_{OS}$. The gain G, which is substantially the same for all amplifiers $A_L$–$A_N$ since they are matched, is the sum of the desired gain of 2 and a gain error $\Delta G$. $V_{IJ}$ is the difference between $V_{IJ}$ and $(V_U+V_L)/2$. The voltage offset VOS, which is virtually the same for all amplifiers $A_{1-AN}$ because of the matching, is ideally zero.

The A/D converter of FIG. 3 contains a composite feedback system consisting of a gain-control system that causes the gain of each amplifier $A_J$ to stabilize very near the desired gain of 2 and an offset-control system that drives the offset $V_{OS}$ of each amplifier very close to zero. The principal components of the composite system include an auxiliary absolute-value differential amplifier $A_{GC}$ and a further absolute-value differential amplifier $A_{OC}$. Both are powered by the $V_{CC}$ supply and matched to main amplifiers $A_1$-$A_N$. Because of the matching, amplifiers $A_{GC}$ and $A_{OC}$ have virtually the same gain and offset as amplifiers $A_1$-$A_N$. As a result, amplifiers $A_{GC}$ and $A_{OC}$ have the same transfer function. Likewise, each amplifier $A_{GC}$ or $A_{OC}$ contains a differential portion $D_{GC}$ or $D_{OC}$ and a buffer portion $B_{GC}$ or $B_{OC}$ corresponding respectively to portions $D_J$ and $B_J$ in amplifier $A_J$.

In the gain-control system, amplifier $A_{GC}$ generates an auxiliary output voltage signal $V_{OGC}$ in response to a pair of input signals which differ by $(V_U-V_L)/2$—i.e., half of the $V_L$-to-$V_U$ voltage range. Preferably these input signals are at the $V_U$ and $(V_U+V_L)/2$ levels. Output $V_{OGC}$ is supplied principally to the inverting input of an operational amplifier $E_{GC}$ and also to an impedance matching circuit 22. The combination of amplifier $E_{GC}$ and circuit 22 has substantially the same input impedance as amplifier $A_J$ so that the output $V_{OGC}$ effectively "sees" amplifier $A_J$. Signal $V_U$ is also supplied as a baseline signal to the non-inverting input of amplifier $E_{GC}$. Responsive to the voltage difference between signals $V_U$ and $V_{OGC}$, amplifier $E_{GC}$ generates a gain-control (error) signal $V_{EGC}$ which is fed back to the gain-control input terminal of differential portion $D_{GC}$ in amplifier $A_{GC}$. Control voltage $V_{EGC}$ is also supplied to the gain-control input terminals of differential portions $D_1$-$D_N$ and $D_{OC}$ in amplifiers $A_1$-$A_N$ and $A_{OC}$.

The gain control works in the following manner. Assume that gain error $\Delta G$ is non-zero, while offset $V_{OS}$ is zero. Since the input difference to amplifier $A_{GC}$ is $(V_U-V_L)/2$, output $V_{OGC}$ is $V_U+\Delta G(V_U-V_L)/2$. Accordingly, the input voltage difference to amplifier $E_{GC}$ is $-\Delta G(V_U-V_L)/2$ which causes control voltage $V_{EGC}$ to drop below its nominal value if $\Delta G$ is positive and to rise above its nominal value if $\Delta G$ is negative. By virtue of the feedback loop to amplifier $A_{GC}$, a decrease in control signal $V_{EGC}$ below its nominal value causes the gain of amplifier $A_{GC}$ to decrease, and vice versa. Its gain thereby stabilizes very close to the desired gain of 2. Because amplifiers $A_1$-$A_N$ and $A_{OC}$ are matched to amplifier $A_{GC}$ and receive control signal $V_{EGC}$, their gains also stabilize very near 2.

Signal $V_U$ is supplied from the upper end of a voltage divider 24 whose lower end supplies end-point signal $V_L$ and is coupled through a current source $I_R$ to the $V_{EE}$ supply. Divider 24 consists of resistors $R_U$ and $R_L$ whose resistances are the same. A low-current signal $(V_U+V_L)/2$ is provided from the mid-point of divider 24 to the non-inverting input of an operational amplifier 26 whose output is fed back to its inverting input so that amplifier 26 has a closed-loop gain of 1. The output of amplifier 26 is voltage $(V_U+V_L)/2$ which is at a sufficiently high current level to drive the $A_1$-$A_N$, $A_{GC}$, and $A_{OC}$ inputs that are at $(V_U+V_L)/2$.

Moving on to the offset-control system, amplifier $A_{OC}$ receives a pair of input signals at the same value. So as to most closely duplicate the average condition in amplifier $A_1$ utilized in generating the most significant bit, this value is preferably $(V_U+V_L)/2$. As a result, amplifier $A_{OC}$ generates a further output voltage signal $V_{OOC}$ that equals $V_L+V_{OS}$.

Output $V_{OOC}$ is supplied to the non-inverting input of an operational amplifier $E_{OC}$ and also to an impedance matching circuit 28. The combination of amplifier $E_{OC}$ and circuit 28 duplicates the input impedance of amplifier $A_J$, causing output VOOC to effectively "see" amplifier $A_J$. End point $V_L$ is supplied from divider 24 to the inverting input of amplifier $E_{OC}$. Consequently, the input voltage difference to amplifier $E_{OC}$ is offset $V_{OS}$. Responsive to this difference, amplifier $E_{OC}$ generates an offset-control (error) signal which is baseline voltage $V_U$ at the top of divider 24 here. In this way, amplifier $E_{OC}$ also provides the supply voltage for divider 24.

The offset control works in the following way. Amplifier $E_{OC}$ causes voltage $V_U$ to rise above its nominal level when offset $V_{OS}$ is positive, and vice versa. The voltage at each point on divider 24 changes by the same amount. In particular, signals $V_L$ and $(V_U+V_L)/2$ each change by this amount.

Assuming output $V_{OOC}$ to be constant, adjustment of voltage $V_L$ resulting from its feedback to amplifier $E_{OC}$ regulates offset $V_{OS}$. This occurs because amplifier $E_{OC}$ can tolerate only an extremely small input voltage difference. $V_{OOC}$ which equals $V_L+V_{OS}$ then equates to signal $V_L$. Accordingly, end point $V_L$ appropriately adjusts to force offset $V_{OS}$ toward zero. Since amplifiers $A_1$-$A_N$ and $A_{GC}$ are matched to amplifier $A_{OC}$, their offsets likewise closely approach zero.

In fact, output $V_{OOC}$ does vary. Its variance is regulated in a manner that causes voltage $(V_U+V_L)/2$ to reach a value suitable for the operation of amplifiers $A_1$-$A_N$. Amplifiers $A_{GC}$ and $E_{GC}$ are involved here. Excluding any gain change, output $V_{OGC}$ does not change when signal $V_U$ changes since the difference between signals $V_U$ and $(V_U+V_L)/2$ is constant. The input voltage difference to amplifier $E_{GC}$ then increases to raise control signal $V_{EGC}$ when offset $V_{OS}$ is positive, and vice versa. In turn, the change in voltage $V_{EGC}$ which is fed back to the gain-control input of amplifier $A_{OC}$ causes the $V_L$ term in output $V_{OOC}$ to change. In response, amplifier $E_{OC}$ and divider 24 provide signal $(V_U+V_L)/2$ at an acceptable level.

This converter also contains a linearity control 30 which generates a linearity-control voltage signal $V_{LC}$ that is supplied to the current-control inputs of buffers $B_1$-$B_N$, $B_{GC}$, and $B_{OC}$ in amplifiers $A_1$-$A_N$, $A_{GC}$, and $A_{OC}$. Control voltage $V_{LC}$ is suitably adjusted so as to induce a linear relationship between output $V_{OJ}$ or $V_{OGC}$ and the absolute value of the input voltage difference to each amplifier $A_J$ or $A_{GC}$.

Figure 4:
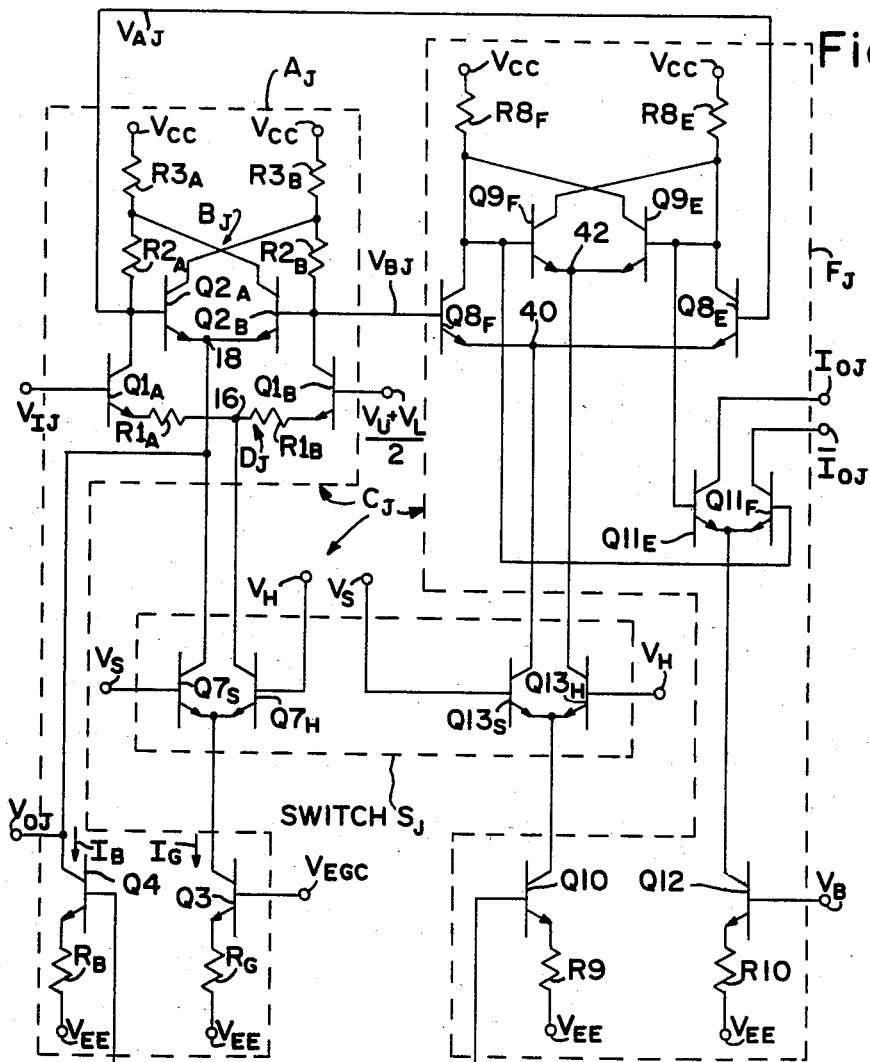
FIG. 4 is a circuit diagram of an absolute-value differential amplifier and associated linearity control suitable for the converter of FIG. 3 as well as FIG. 6 or 7.

FIG. 4 shows the circuitry for a cell containing each main amplifier $A_J$ and its associated comparator $C_J$ plus the circuitry for linearity control 30 employed in FIG. 3. The circuitry employed for amplifier $A_J$ is also employed for amplifiers $A_{GC}$ and $A_{OC}$. For convenience, they are laid out in an integrated circuit in cells identical to the $A_J$ cell. That is, the portion of the circuitry not used for the absolute-value differential amplifying function in the $A_{GC}$ and $A_{GC}$ cells is also laid out but is inactive. Unless otherwise indicated, the transistors shown in FIG. 4 are all NPN bipolar transistors having the same emitter area.

Figure 1:
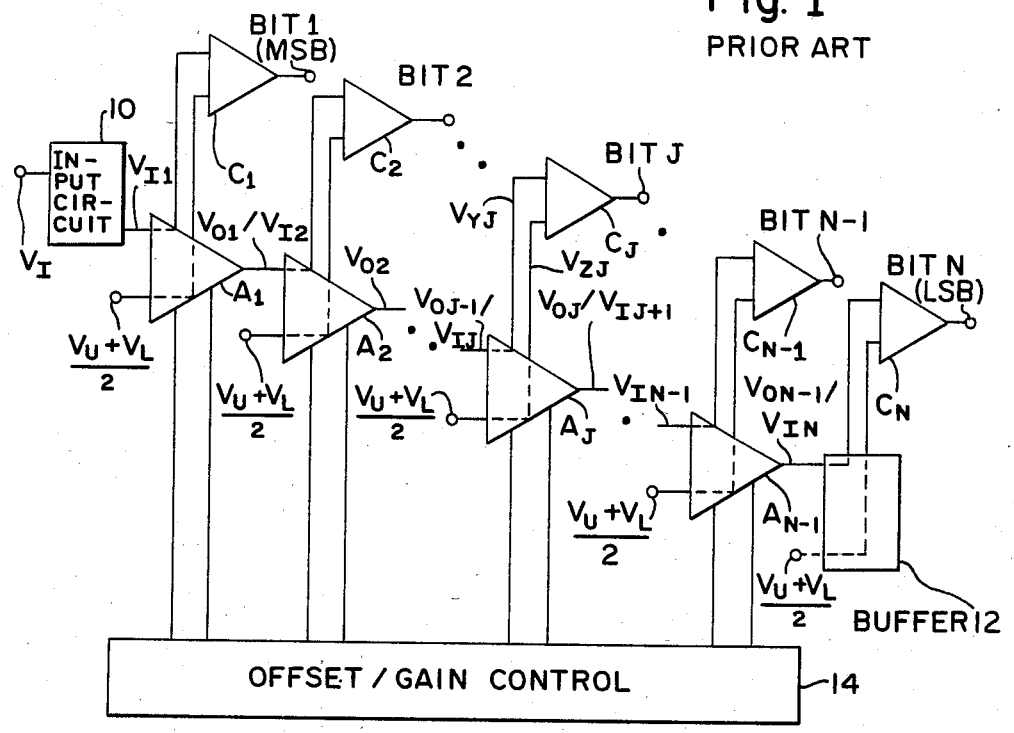
FIG. 1 is a block diagram of a prior art absolute-value A/D converter in which each absolute-value differential amplifier has a desired gain of two.
Figure 2:
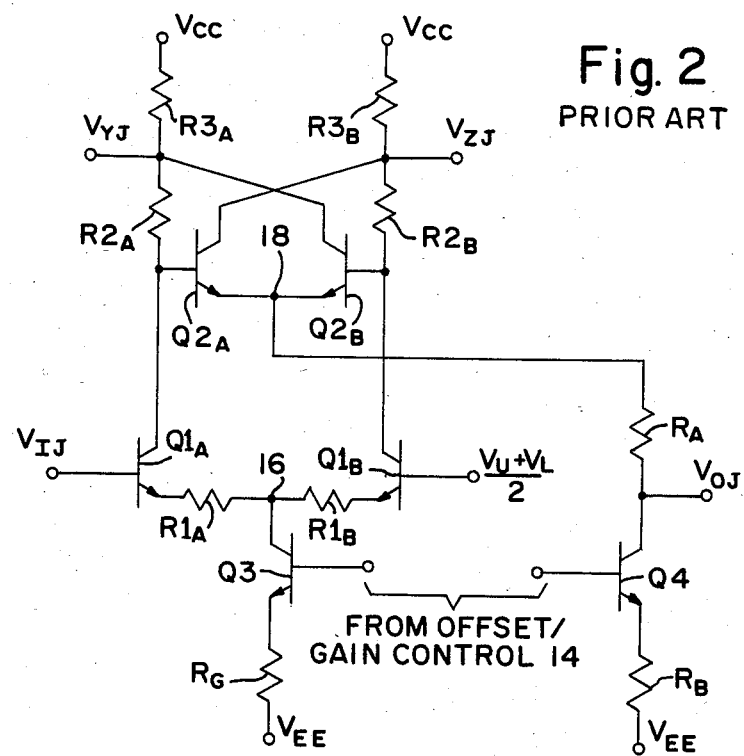
FIG. 2 is a circuit diagram of a prior art absolute-value differential amplifier employable in the converter of FIG. 1.

Amplifier $A_J$ contains transistors $Q1_A$ and $Q1_B$ as the active part of differential portion $D_J$, resistors $R1_A$ and R1$_B$ which have the same resistance R$_1$, transistors Q2$_A$ and Q2$_B$ as the active part of buffer B$_J$, resistors R2$_A$ and R2$_B$ which have the same resistance R$_2$, resistors R3$_A$ and R3$_B$ which have the same resistance R$_3$, the current source formed by transistor Q3 and resistor R$_G$, and the current source formed by transistor Q4 and resistor R$_B$. These elements are connected as shown in FIG. 4 and also as described above for FIG. 2. (Resistor R$_4$ is absent in FIG. 4.) Voltages V$_{AJ}$ and V$_{BJ}$ are respectively supplied from the Q1$_A$ and Q1$_B$ collectors. Voltage V$_{EGC}$ is supplied to the base of transistor Q3 to control the gain current I$_G$ for differential portion D$_J$. The gain is approximately $(R_2+R_3)/2(R_1+kT/qIG)$ where k is Boltzmann's constant, T is the device temperature, and q is the electronic charge. Voltage V$_{LC}$ is supplied to the base of transistor Q4 to control the buffer current I$_B$ for buffer B$_J$.

As previously mentioned, the cross-coupling of transistors Q2$_A$ and Q2$_B$ improves the linearity between output V$_{OJ}$ and mainline input V$_{IJ}$ when it is near reference input $(V_U+V_L)/2$. Buffer current I$_B$ may be expressed as CkT/qR$_3$ where C is a constant. The linearity is best when C is in the range of 1.5–1.7 and is very near 1.6. Linearity control 30 regulates current I$_B$ so as to bring it very close to the optimum value.

Circuit 30 contains transistors Q5 and Q6 whose bases are coupled together through a node 32. The Q5 emitter area differs from and is normally greater than the Q6 emitter area by a factor M$_C$ which is optimally 5. Although transistor Q5 is represented as having multiple emitters, it is normally laid out as a group of parallel transistors each having the same emitter area as transistor Q6. A resistor R4 having a resistance R$_4$ is coupled between the V$_{EE}$ supply and the Q5 emitter. Resistors R5$_C$ and R5$_D$ having the same resistance R$_5$ as resistor R$_B$ are connected between the V$_{EE}$ supply and the Q5 and Q6 emitters, respectively, resistors R4 and R5$_C$ being in series.

Resistors R6$_C$ and R6$_D$ having the same resistance R$_6$ are connected between the V$_{CC}$ supply and the Q5 and Q6 collectors, respectively. An operational amplifier E$_{LC}$ supplies control voltage V$_{LC}$ at node 32 to drive the Q5 and Q6 bases. The inputs of amplifier E$_{LC}$ are connected to the Q5 and Q6 collectors. The E$_{LC}$ input connections could be reversed from those shown. A resistor R7 is connected between node 32 and the Q5 base to compensate for base resistance mismatch due to the different areas of transistors Q5 and Q6.

Inasmuch as amplifier F$_{LC}$ can tolerate only a very small input voltage difference for control 30 to be stable, the Q5 and Q6 collector voltages are virtually the same. As a result, the collector-emitter currents through transistors Q5 and Q6 are virtually the same. Since their saturation currents differ by the ratio M$_C$, the Q6 current turns out to be approximately $(kT/qR_4)\ln M_C$ which has the same temperature dependence as buffer current I$_B$. In general the Q4 emitter area to the Q6 emitter area may differ from unity by a factor M$_B$. As a result I$_B$ is $(kT/qR_4)M_B\ln M_C$. Thus, by setting $(R_3/R_4)M_B\ln M_C$ equal to C, voltage V$_{LC}$ is at precisely the value that causes buffer current I$_B$ to vary linearly with temperature T.

In the preferred embodiment, R$_3$ and R$_4$ are the same. M$_B$ is 1, while M$_C$ is 5. Accordingly, C is 1n5 or about 1.61.

Figure 5:
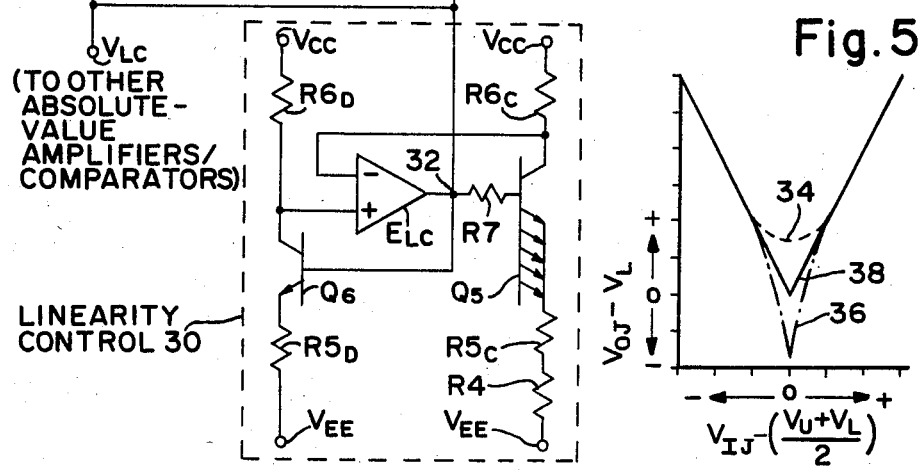
FIG. 5 is a graph of amplifier output-to-input voltage that results from using the linearity control of FIG. 4.

FIG. 5 illustrates how linearity control 30 interacts with the cross-coupling of transistors Q2$_A$ and Q2$_B$ to provide the proper amount of positive feedback for causing V$_{OJ}$ to vary linearly with $|V_{IJ}-(V_U+V_L)/2|$. Curve 34 which rounds off near the point at which input V$_{IJ}$ equals the reference input represents the case where there is insufficient or no feedback. Curve 36 which forms a cusp represents the situation where there is too much feedback. Curve 38 represents the case in which there is precisely the proper amount of feedback.

Returning to FIG. 4, each amplifier A$_J$ also serves as part of associated comparator C$_J$. This is accomplished with a corresponding switch S$_J$ containing transistors Q7$_H$ and Q7$_S$ connected between the Q3 collector and nodes 16 and 18, respectively. A voltage V$_H$ drives the base of transistor Q7$_H$. A complementary voltage V$_S$ drives the base of transistor Q7$_S$.

When amplifier A$_J$ is being operated in its absolute-value amplification mode, signal V$_H$ is at a suitable high voltage to turn on transistor Q7$_H$, whereas opposite signal V$_S$ is at a sufficiently low voltage to turn off transistor Q7$_S$. The Q3 current source then supplies current I$_G$ through transistor Q7$_H$ to differential portion D$_J$, while the Q4 current source similarly supplies current I$_B$ to buffer B$_J$.

Amplifier A$_J$ is switched to its comparing mode by dropping voltage V$_H$ to the low voltage to turn off transistor Q7$_H$. This cuts off the operating current to transistors Q1$_A$ and Q1$_B$. They turn off to prevent inputs V$_{IJ}$ and $(V_U+V_L)/2$ from affecting transistors Q2$_A$ and Q2$_B$. At the same time, signal V$_S$ is raised to the high voltage to turn on transistor Q7$_S$. This enables the current from the Q3 current source to switch to transistors Q2$_A$ and Q2$_B$ so as to further amplify the amplified voltage difference at their bases. Transistors Q2$_A$ and Q2$_B$ latch in either a binary "0" logic state or a binary "1" logic state depending on whether mainline signal V$_{IJ}$ exceeded reference signal $(V_U+V_L)/2$ or not just before signal V$_S$ went high. Signals V$_{AJ}$ and V$_{BJ}$ now serve as complementary signals representative of the A$_J$ logic state.

Each comparator C$_J$ preferably also includes a corresponding comparing amplifier F$_J$ for amplifying the voltage difference between signals V$_{AJ}$ and V$_{BJ}$ when amplifier A$_J$ is being operated as a latch. Comparing amplifier F$_J$ converts this amplified voltage difference into a current output signal I$_{OJ}$ that represents bit J of the digital signal. Amplifier F$_J$ also provides a current output signal $\overline{I}_{OJ}$ complementary to output I$_{OJ}$. When amplifier A$_J$ is in its amplifying mode, switch S$_J$ causes amplifier F$_J$ to latch signals I$_{OJ}$ and $\overline{I}_{OJ}$.

Amplifier F$_J$ contains a pair of differential-input transistors Q8$_E$ and Q8$_F$ interconnected through a node 40, a pair of cross-coupled storage transistors Q9$_E$ and Q9$_F$ interconnected through a node 42, resistors R8$_E$ and R8$_F$ having the same resistance R$_8$, a current source formed by a transistor Q10 and a series resistor R9, a pair of output transistors Q11$_E$ and Q11$_F$, and a current source formed by a transistor Q12 and a series resistor R$_{10}$, all connected as shown in FIG. 4. A voltage such as voltage V$_{LC}$ drives the Q10 current source. A bias voltage V$_B$ drives the Q12 current source.

Switch S$_J$ in comparator C$_J$ further includes a pair of transistors Q13$_H$ and Q13$_S$ whose bases respectively receive signals V$_H$ and V$_S$. Transistors Q13$_H$ and Q13$_S$ are connected between the Q10 collector and nodes 42 and 40, respectively, as shown in FIG. 4.

When amplifier A$_J$ is being operated as a latch, signal V$_S$ is high to turn on transistor Q13$_S$ and enable transistors Q8$_E$ and Q8$_F$ to amplify the voltage difference between signals V$_{AJ}$ and V$_{BJ}$. The Q8$_E$ and Q8$_F$ collectors drive transistors Q11$_E$ and Q11$_F$ so as to turn one of them on and the other off depending on whether voltage V$_{AJ}$ exceeds voltage V$_{BJ}$ or not. Output I$_{OJ}$ is at a "0" if transistor Q11$_E$ is turned on, and vice versa. Likewise, output $\bar{I}_{OJ}$ is at a "1" if transistor Q11$_F$ is turned off, and vice versa. At the same time, signal V$_H$ is low so as to turn off transistor Q13$_H$. This turns off transistors Q9$_E$ and Q9$_F$.

Transistor Q13$_S$ turns off when signal V$_S$ goes low. This turns off transistors Q8$_E$ and Q8$_F$ to prevent voltages V$_{AJ}$ and V$_{BJ}$ from affecting amplifier F$_J$. Simultaneously, transistor Q13$_H$ goes on as signal V$_H$ goes high. This turns on transistors Q9$_E$ and Q9$_F$. Because they are cross-coupled, they latch at either a "0" or "1" depending on whether voltage V$_{AJ}$ exceeded voltage V$_{BJ}$ or not when signal V$_H$ went high. The Q9$_F$ and Q9$_E$ collectors then drive transistors Q11$_E$ and Q11$_F$ to force them to continue to provide the data bit and its complement to outputs I$_{OJ}$ and $\bar{I}_{OJ}$.

Switch S$_J$ is preferably operated in coordination with sample-and-hold/level shift circuit 20. When signal V$_H$ is high, circuit 20 holds input V$_{J1}$ at the current value. At this time, amplifiers A$_1$-A$_N$ are in their amplifying mode while amplifiers F$_1$-F$_N$ are operating as latches to provide the digital signal of the prior sampling. When signal V$_H$ goes low, circuit 20 allows analog signal V$_{J1}$ to be sampled. Amplifiers A$_1$-A$_N$ then latch while amplifiers F$_1$-F$_N$ receive and amplify their data bits to provide the digital signal. When signal V$_H$ goes high again, amplifiers F$_1$-F$_N$ latch to continue providing the same digital signal.

Preferably, N is 8. Voltages V$_{CC}$ and V$_{EE}$ are 5 and −5 volts, respectively. Bias voltage V$_B$ is −4 volts. Resistors R$_U$ and R$_L$ are each 250 ohms. Current source I$_R$ is 1 milliampere. R$_1$, R$_2$, R$_3$=R$_4$, R$_6$, and R$_8$ are 200, 800, 118, 2,000, and 200 ohms, respectively. Resistor R$_B$ which equals R$_5$ is 1,000 ohms. Resistors R$_G$, R7, R9, and R10 are each 500 ohms. Each operational amplifier E$_{GC}$, E$_{OC}$, 26, or E$_{LC}$ is conventional in design and has an open-loop gain greater than 10,000.

Figure 6:
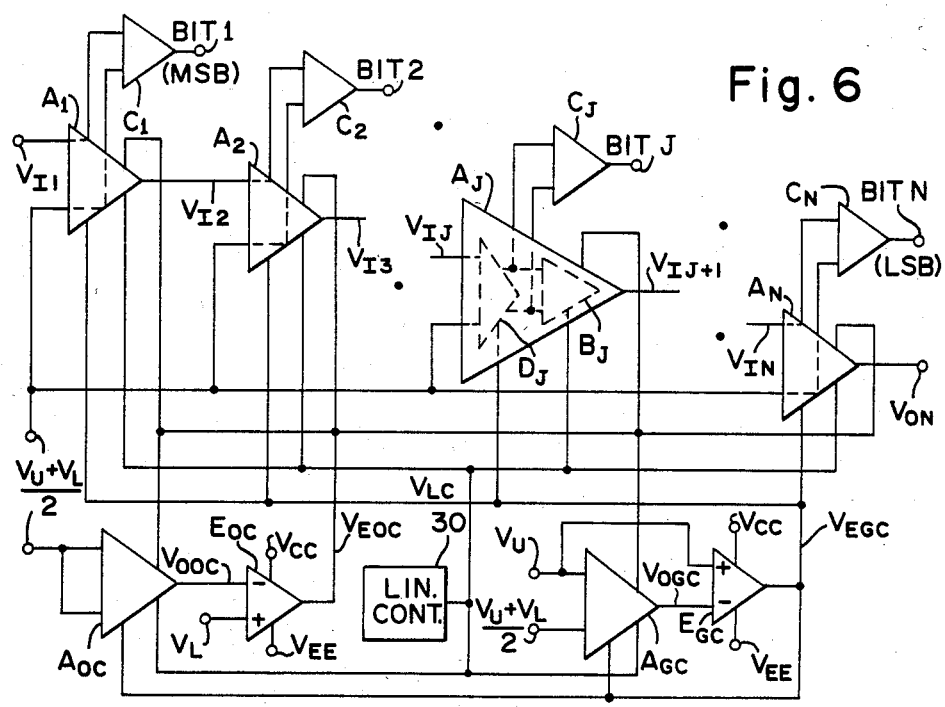
FIG. 6 is a block diagram of an A/D converter in accordance with the invention in which each absolute-value differential amplifier has a desired gain of two and in which largely separate feedback circuits provide gain and offset control.

FIG. 6 shows another A/D converter having a feedback control system for causing the gains of matched amplifiers A$_1$-A$_N$ to closely approach 2 and for making their offsets very small. Each amplifier A$_J$ and its associated comparator C$_J$ are preferably configured and operable the same as described for FIGS. 3 and 4. The control system of FIG. 6 again utilizes amplifiers A$_{GC}$ and A$_{OC}$ which are matched to amplifiers A$_1$-A$_N$ and are internally configured and operable the same as amplifier A$_J$. This control system also contains amplifiers E$_{GC}$ and E$_{OC}$ which operate between the V$_{EE}$ and V$_{CC}$ supplies. The converter of FIG. 6 contains linearity control 30 configured and operable the same as in FIGS. 3 and 4. For simplicity, circuits 20, 22, and 28 are not shown in FIG. 6 although they are employed in this converter.

In FIG. 6, voltages V$_L$, (V$_U$+V$_L$)/2, and V$_U$ are fixed values preferably generated from an external voltage divider (not shown). Signal (V$_U$+V$_L$)/2 is again provided as the reference input to each amplifier A$_J$, as one of the inputs to amplifier A$_{GC}$, and as both inputs to amplifier A$_{OC}$. The other input to amplifier A$_{GC}$ is again signal V$_U$.

The gain-control system here is largely separate from the offset-control system. In the gain control, amplifiers A$_{GC}$ and E$_{GC}$ function in the same manner as described for FIG. 3.

In the offset control, amplifier A$_{OC}$ again provides output V$_{OOC}$ at a value of V$_L$+V$_{OS}$. In response to output V$_{OOC}$ and end point V$_L$ supplied respectively to the inverting and non-inverting inputs of amplifier E$_{OC}$, it generates an offset-control (error) signal V$_{EOC}$ which is fed back to the supply voltage input of amplifier A$_{OC}$. If offset V$_{OS}$ is positive, supply voltage V$_{EOC}$ decreases. This forces offset V$_{OS}$ downward toward zero. The reverse occurs if V$_{OS}$ is negative. Control signal V$_{EOC}$ is provided as the supply voltage to amplifiers A$_1$-A$_N$ and A$_{GC}$ and thereby forces their offsets toward zero because of the matching.

More particularly, if V$_{EOC}$ and V$_{OOC}$ are respectively substituted for V$_{CC}$ and V$_{OJ}$ in FIG. 4, V$_{OOC}$ equals V$_{EOC}$−K, where K is a constant since the inputs to amplifier A$_{OC}$ are balanced. Accordingly, V$_{EOC}$−V$_{OS}$ is equal to V$_L$+K. Since V$_L$ is also constant here, decreasing output V$_{OOC}$ decreases offset V$_{OS}$, and vice versa.

Figure 7:
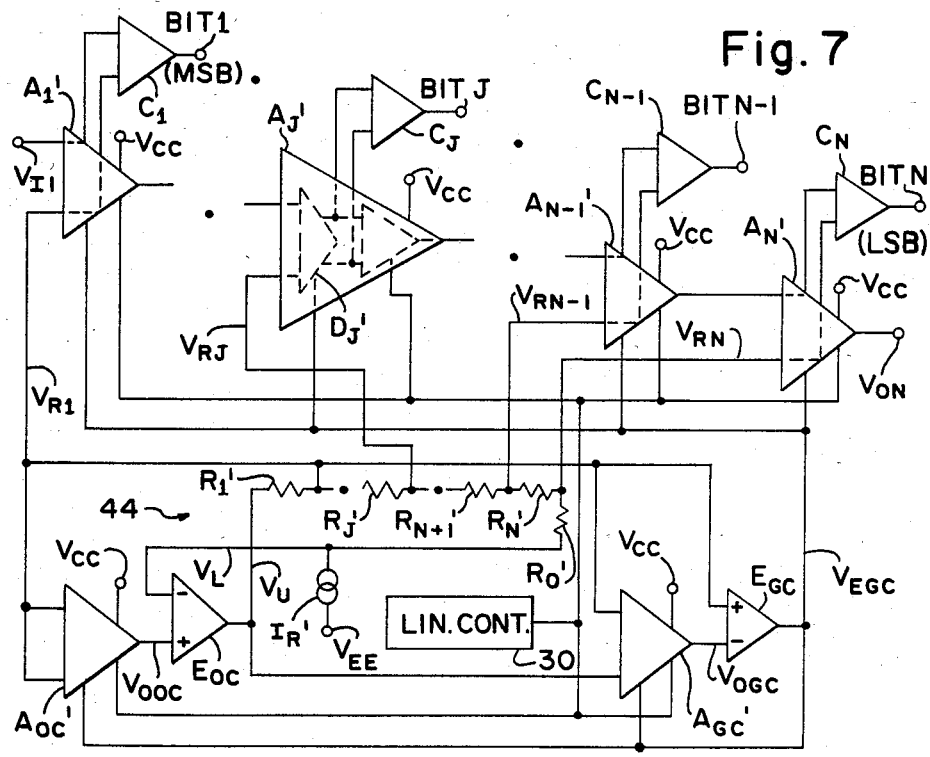
FIG. 7 is a block diagram of an A/D converter in accordance with the invention in which each absolute-value differential amplifier has a desired gain different from two and in which gain/offset control is achieved with a composite feedback system.

FIG. 7 illustrates another absolute-value A/D converter having a composite feedback system for gain/offset control generally of the type described for FIG. 3. The principal difference is that this converter uses a different absolute-value algorithm. The prime notation is employed in FIG. 7 to indicate elements that differ in some way from those of FIG. 3. The elements operating the same as in FIG. 3 are largely not discussed here.

A chain of matched absolute-value differential amplifiers A$_1'$-A$_N'$ performs the A/D conversion in combination with corresponding comparators C$_1$-C$_N$. The gain/offset control system utilizes absolute-value differential amplifiers A$_{GC}'$ and A$_{OC}'$ matched to amplifiers A$_1'$-A$_N'$. Each amplifier A$_J'$, A$_{GC}'$, or A$_{OC}'$ is internally configured and basically operable the same as respective amplifier A$_J$, A$_{GC}$, or A$_{OC}$ of FIGS. 3 and 4. Amplifiers A$_1'$-A$_N'$, A$_{GC}'$, and A$_{OC}'$ all have the same gain. Linearity control 30 operates the same as in FIGS. 3 and 4. Circuits 20, 22, and 28 are also incorporated in this converter although not shown in FIG. 7.

The desired gain for each amplifier A$_J'$, A$_{GC}'$, or A$_{OC}'$ is different from 2. This is done by changing the values given above for some of the absolute-value amplifier resistors shown in FIG. 4. Each main amplifier A$_J'$ receives a reference input signal V$_{RJ}$ normally different from that supplied to each other main amplifier A$_J'$. Each reference input V$_{RJ}$ is provided from the lower end of a resistor R$_J'$ in a set of upper resistors R$_1'$-R$_N'$ in a voltage divider 44 also including a lower resistor R$_0'$. Signal V$_U$ is supplied to the upper end of divider 44 while its lower end provides signal V$_L$ and is coupled through a current source I$_R'$ to the V$_{EE}$ supply. Auxiliary amplifier A$_{GC}'$ receives a pair of input signals from different points on divider 44, while further amplifier A$_{OC}'$ receives a pair of input signals at the same value provided from a point on divider 44.

For example, this D/A converter might use an absolute-value algorithm in which amplifiers A$_1'$-A$_N'$, A$_{GC}'$, and A$_{OC}'$ all have a desired gain of 1. (Although "buffers" might perhaps be a better description here for elements A$_1'$-A$_N'$, A$_{GC}'$ and A$_{OC}'$, they are still referred to categorically as "amplifiers" in semiconductor language.) In this case, each input V$_{RJ}$ is V$_L$+(V$_U$−V$_L$)/2$^J$. The resistance of each resistor R$_J'$ in divider 44 is 2$^{N-J}$ times that of resistor R$_0'$.

The gain-control system in FIG. 7 operates in the same manner as in FIG. 3. The same type of feedback path to the gain-control input of amplifier A$_{GC}'$ forces its gain toward the desired gain. Branches of this path to the gain-control inputs of amplifiers $A_1'$-$A_N'$ and $A_{OC}'$ then force their gains toward the desired gain as a result of the amplifier matching.

The offset-control system of FIG. 7 also operates in the same manner as in FIG. 3. Amplifier $A_{OC}$ again supplies output $V_{OOC}$ at a value of $V_L+V_{OS}$. Responsive to the voltage difference between signals $V_{OOC}$ and $V_L$, amplifier $E_{OC}$ generates voltage $V_U$ at the top of divider 44. Signal $V_U$ differs from its nominal value when offset $V_{OS}$ is non-zero. This difference is reflected at each point along divider 44, including end point $V_L$. The $V_L$ feedback to amplifier $E_{GC}$ causes it to adjust signal $V_U$ (and also signal $V_L$) to make offset $V_{OS}$ closely approach zero. The offsets of amplifiers $A_1'$-$A_N'$ and $A_{GC}'$ are then driven toward zero because of the matching. The values of reference inputs $V_{R1}$-$V_{RN}$ suitable for the operation of amplifiers $A_1'$-$A_N'$ are determined by a control path further involving amplifiers $A_{GC}'$ and $E_{GC}$ analogous to that described for FIG. 3.

Methods for manufacturing the various elements of the present A/D converters are well known in the semiconductor art. Each of them is preferably fabricated as a monolithic integrated circuit according to conventional processing techniques using PN junction isolation to separate active regions on a semiconductor wafer. The absolute-value amplifiers are all laid out in a row on the wafer so as to be substantially the same topographically.

While the invention has been described with reference to particular embodiments, this description is solely for the purpose of illustration and is not to be construed as limiting the scope of the invention claimed below. For example, semiconductor elements of opposite polarity to those described above may be employed to accomplish the same results. Metal-oxide semiconductor elements could be used for part or all of the bipolar circuitry. Thus, various modifications, changes, and applications may be made by those skilled in the art without departing from the true scope and spirit of the invention as defined by the appended claims.

What is claimed is:

1. A device for converting an analog signal into a digital signal in which each of a chain of main absolute-value differential amplifiers designated sequentially as the first amplifier through the last amplifier produces an output signal by amplifying the absolute value of the voltage difference between a pair of input signals of which one is a mainline signal and the other is a reference signal, the analog signal is the mainline signal to the first amplifier, the output signal of each amplifier except the last amplifier is the mainline signal to the next amplifier, and comparing means generates the digital signal by determining whether the mainline signal to each amplifier exceeds its reference signal, characterized by a gain-control system comprising:

an auxiliary absolute-value differential amplifier matched to the main amplifiers which are matched to one another for likewise producing an auxiliary output signal from a pair of input signals; and gain-control feedback means responsive to the voltage difference between the auxiliary output signal and a baseline signal substantially the same as the auxiliary output signal when the gain of the auxiliary amplifier is at a desired gain for generating a gain-control signal that controls a path back to the auxiliary amplifier to cause its gain to stabilize very near the desired gain and controls paths to the main amplifiers to cause their gains to stabilize very near the desired gain.

2. A device as in claim 1 characterized by an offset-control system comprising:

a further absolute-value differential amplifier matched to the other amplifiers for likewise producing a further output signal from a pair of input signals which are substantially equal so that the further output signal differs from an end-point level by no more than an offset; and offset-control feedback means responsive to the voltage difference between the further output signal and an end-point signal at the end-point level for generating an offset-control signal that controls at least one path back to the offset-control system to force the offset toward zero and thereby forces offsets of the other amplifiers toward zero.

3. A device as in claim 2 characterized in that the feedback means comprise:

an operational amplifier for generating the offset-control signal in response to the further output signal and the end-point signal;

a voltage divider of which one end receives the offset-control signal and the other end provides the end-point signal, the input signals to the auxiliary amplifier and the baseline signal being derived from points on the divider;

an operational amplifier for generating the gain-control signal in response to the auxiliary output signal and the baseline signal; and means for transmitting the gain-control signal to a gain-control input terminal on each absolute-value amplifier.

4. A device as in claim 3 characterized in that the reference signals are derived from at least one point on the divider.

5. A device as in claim 4 wherein the desired gain is precisely 2, characterized in that the reference signals are all derived from a single point midway along the divider.

6. A device as in claim 2 characterized in that the comparing means comprises:

the main amplifiers; and switching means for enabling each main amplifier to be switchably operable as a latch that (a) assumes one of a pair of binary logic states depending on whether the mainline signal to that main amplifier exceeds its reference signal and (b) provides at least one signal corresponding to the assumed logic state and representing a bit portion of the digital signal.

7. A device as in claim 6 characterized in that:

each main amplifier when it is operated as a latch provides a pair of complementary signals corresponding to its assumed logic state;

the comparing means further includes a plurality of comparing amplifiers corresponding one to one to the main amplifiers, each comparing amplifier operable to (a) compare the complementary signals from the corresponding main amplifier when it is operated as a latch and (b) provide a data bit of digital signal depending on the result of the comparison; and the switching means further enables each comparing amplifier to be switchably operable as a latch that continues to provide the data bit from that comparing amplifier when the corresponding main amplifier is not operated as a latch.

8. A device as in claim 2 wherein each main amplifier comprises: a pair of first resistors; a first current source coupled to a first voltage supply; a pair of first like-polarity bipolar transistors whose emitters are individually coupled through the first resistors to the first current source and whose bases are individually responsive to the input signals to that main amplifier; a second current source coupled to the first voltage supply; a pair of second resistors; a pair of third resistors; a like-polarity pair of second bipolar transistors whose emitters are coupled to the second current source to supply the output signal from that main amplifier, whose bases are individually coupled to the collectors of the first transistors, and whose collectors are cross-coupled individually through the second resistors to the bases of the second transistors and are individually coupled through the third resistors to a second voltage supply; characterized in that the first current source comprises a like-polarity third bipolar transistor responsive to the gain-control signal.

9. A device as in claim 8 characterized in that the auxiliary and further amplifiers are responsive to the gain-control signal in the same manner as the main amplifiers.

10. A device as in claim 9 characterized in that the comparing means comprises:
the main amplifiers; and
switching means for selectively switching the current from the first current source away from the first transistors to the second transistors so as to enable each main amplifier to be switchably operable as a latch that (a) assumes one of a pair of binary logic states depending on whether the mainline signal to that main amplifier exceeds its reference s:gnal and (b) provides at least one signal corresponding to the assumed logic state and representing a bit portion of the digital signal.

11. A device as in claim 10 characterized in that:
each main amplifier when it is operated as a latch provides a pair of complementary signals corresponding to its assumed logic state;
the comparing means further includes a plurality of comparing amplifiers corresponding one to one to the main amplifiers, each comparing amplifier operable to (a) compare the complementary signals from the corresponding main amplifier when it is operated as a latch and (b) provide a data bit of digital signal depending on the results of the comparison; and
the switching means further enables each comparing amplifier to be switchably operable as a latch that continues to provide the data bit from that comparing amplifier when the corresponding main amplifier is not operated as a latch.

12. A device as in claim 8 characterized by linearity-control means for causing the parameter $I_B R_3 q/kT$ to be in the range of 1.5 to 1.7 where $I_B$ is the current passing through the second transistors from the second current source, $R_3$ is the resistance of either of the third resistors whose resistances are substantially equal, and T is the temperature of the device.

13. A device as in claim 8 wherein the second current source comprises a like-polarity fourth bipolar transistor emitter-collector coupled between the first voltage supply and the first resistors, characterized by linearity-control means for driving the base of the fourth transistor with a linearity-control signal that tends to induce a linear relationship between the absolute value of the input signals to that main amplifier and its output signal, the linearity-control means comprising:
a fourth resistor;
a fifth like-polarity bipolar transistor whose emitter is coupled through the fourth resistor to the first voltage supply and whose collector is coupled to the second voltage supply;
a sixth like-polarity bipolar transistor whose emitter is coupled to the first voltage supply, whose base is coupled to the base of the fifth transistor, and whose collector is coupled to the second voltage supply; and
means for driving the bases of the fifth and sixth transistors, maintaining their collector-emitter currents largely equal to each other, and supplying the linearity-control signal.

14. A device as in claim 13 characterized in that the parameter $(R_3/R_4)M_B \ln M_C$ is in the range of 1.5 to 1.7 where $R_3$ is the resistance of either of the third resistors whose resistances are substantially equal, $R_4$ is the resistance of the fourth resistor, $M_B$ is the emitter area ratio of the fourth transistor to the sixth transistor, and $M_C$ is the emitter area ratio of the fifth transistor to the sixth transistor.

15. A device as in claim 14 characterized in that the auxiliary and further amplifiers are responsive to the linearity-control signal in the same manner as the main amplifiers.

16. A device as in claim 2 wherein a supply voltage is provided to the absolute-value amplifiers to power them, characterized in that the feedback means comprise:
an operational amplifier for providing the offset-control signal in response to the further output signal and the end-point signal;
means for transmitting the offset-control signal as the supply voltage to each absolute-value amplifier;
an operational amplifier for generating the gain-control signal in response to the auxiliary output signal and the baseline signal; and
means for transmitting the gain-control signal to a gain-control input terminal of each absolute-value amplifier.

* * * * *